United States Patent [19]
Couper et al.

[11] Patent Number: 4,936,800
[45] Date of Patent: Jun. 26, 1990

[54] PRECISION TEST CONNECTOR

[75] Inventors: William D. Couper; George W. Michael, both of Harrisburg, Pa.

[73] Assignee: AMP Incorporated, Harrisburg, Pa.

[21] Appl. No.: 400,619

[22] Filed: Aug. 30, 1989

[51] Int. Cl.⁵ .................................... H01R 13/00
[52] U.S. Cl. ................................................ 439/863
[58] Field of Search ........................ 439/578–585, 439/863

[56] References Cited

U.S. PATENT DOCUMENTS

| | | | |
|---|---|---|---|
| 3,627,929 | 12/1971 | Vlijmen et al. | 179/96 |
| 4,441,781 | 4/1984 | Forney, Jr. et al. | 339/177 R |
| 4,580,862 | 4/1986 | Johnson | 339/64 R |
| 4,697,859 | 10/1987 | Fisher, Jr. | 439/246 |
| 4,734,651 | 3/1988 | Keller et al. | 324/538 |

Primary Examiner—Joseph H. McGlynn

[57] ABSTRACT

A testing device such as a network analyzer is joined to a test unit, such as a circulator, by an electrical precision test connector 1 having an electrical conductor 2 with conductive end parts 34 and 40, a hollow, bipartite shell 3 and a dielectric insert 4 securing the conductor 2 in place, the electrical conductor 2 comprising a flexible, slotted contact end portion 34 with flat, opposing contact surfaces 36 and 37 with the slotted end portion being pinched 38 for a slideable, clamping engagement, above and below, with an inserted tab connector and the hollow, bipartite shell 3 having an end contact surface 24 and being spring biased at 45 to provide complete electrical contact with a corresponding portion of the test unit 60 during connection.

11 Claims, 3 Drawing Sheets

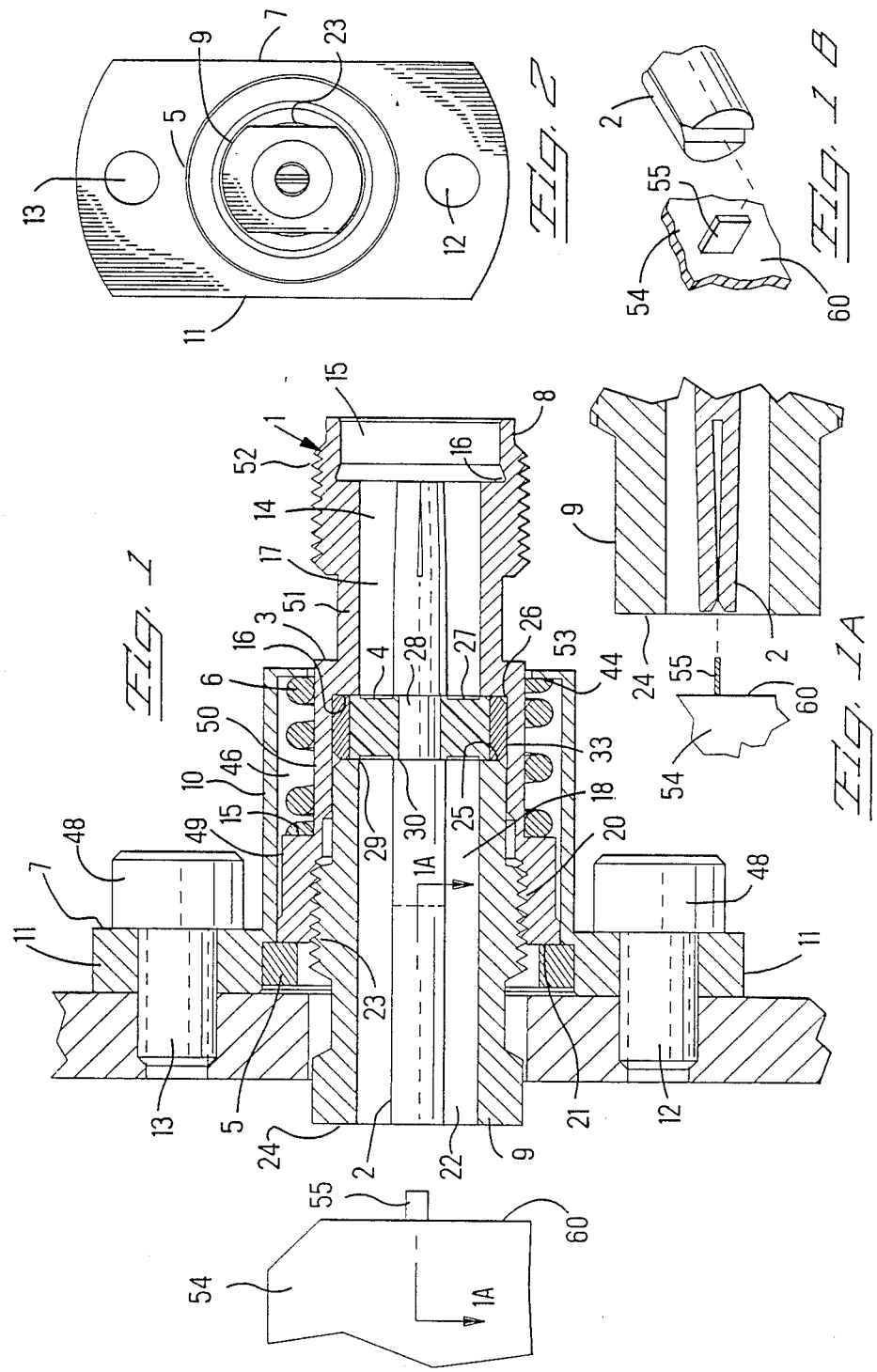

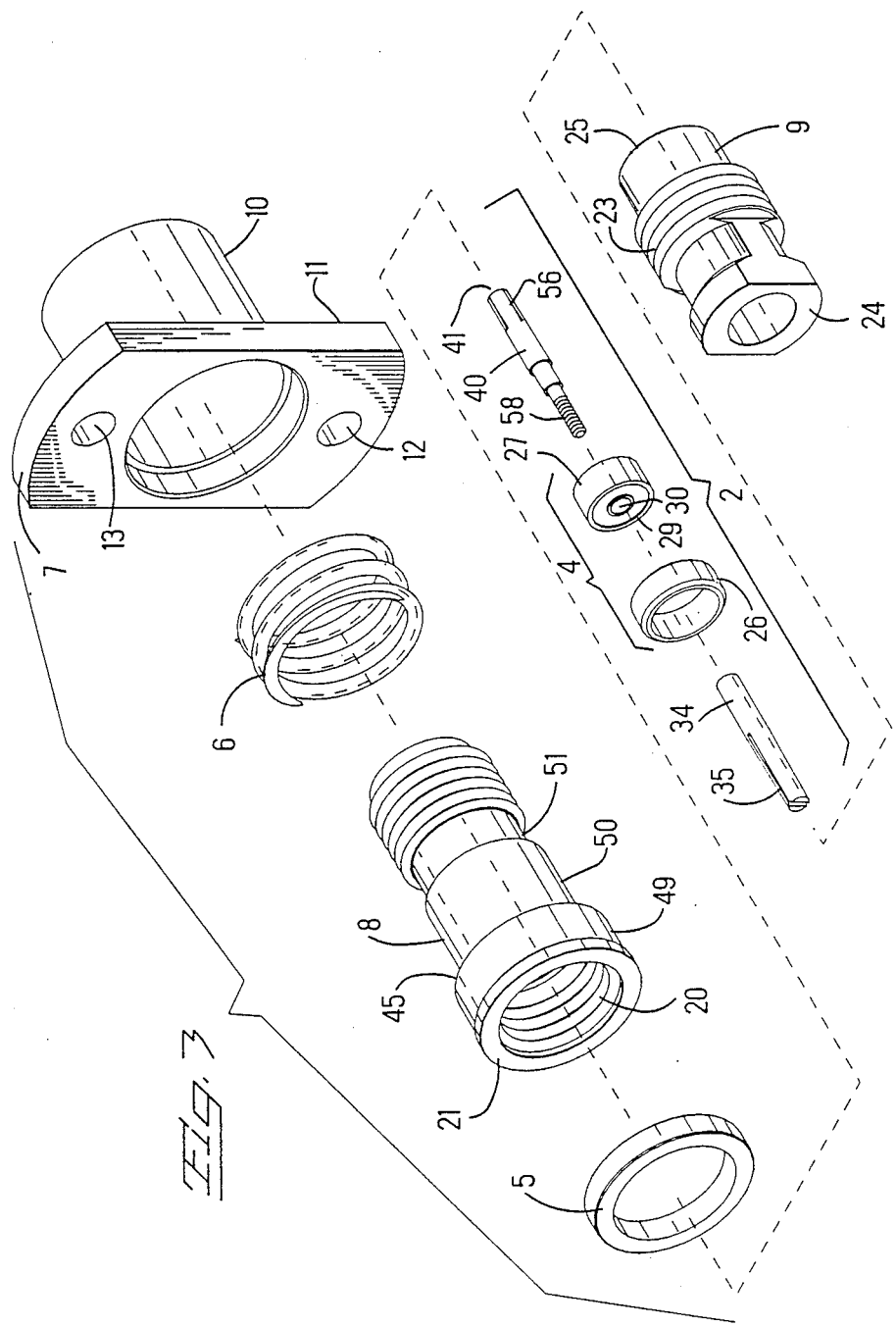

PRECISION TEST CONNECTOR

FIELD OF THE INVENTION

This invention relates to an electrical precision test connector assembly for disconnect connection to the tab lead of a ferrite component such as a circulator or isolator.

BACKGROUND OF THE INVENTION

An electrical precision test connector assembly comprising an electrical conductor with conductive end portions and a hollow shell encircling the electrical conductor is utilized to connect a testing device with a subject ferrite component which is to be tested for electrical continuity, short circuiting or to determine reflection coefficient and the like. More particularly, the precision test connector is utilized in the testing of a ferrite component such as a circulator or isolator operating at microwave frequencies and having thin and narrow tab leads. Exacting standards of performance are set for these components.

Circulators and isolators provide nonreciprocal transmission paths, i.e. microwave energy may travel the transmission path in one direction with little loss but will be greatly absorbed when applied from the opposite direction. The nonreciprocal action provides useful benefits, and circulators are commonly used as duplexers in connection with a transmitter, antenna and receiver, as coupling elements in reflection amplifiers, such as parametic amplifiers and tunnel-diode amplifiers, or in conjunction with bandpass filters. Isolators are used between transmitter and antenna in communications and radar systems to eliminate energy reflected from the load back to the source. Resonance isolators are used as interstage isolators to minimize reflections between circuit elements.

The present invention is applicable to so-called "drop-in" components, particularly circulators and isolators, which are microminiature ferrite devices having input/output tab leads whereby the component with a tab lead is "dropped" onto a printed circuit board and the lead is soldered to form a connection thereto. The tab leads are extensions of the circulator/isolator center conductor itself. The leads may be made of gold-plated beryllium copper. The tab leads are preformed at manufacture to provide optimum contact with the circuit and a tension-free solder joint.

In the testing of circulators and isolators with tab leads, the ferrite component is connected by solder to a single trace micro-strip transmission test fixture and thereto a testing unit such as an automatic vector network analyzer, for the purpose of testing for return and insertion loss to determine reflection coefficient. Connecting testing unit and ferrite component is a time consuming process. Further, the tab lead itself may be damaged by soldering to the test fixture. Indeed, manufacturers recommend that customers test the circulator or isolator components only if there is an unusual need for precise measurement of performance prior to actual use.

Other problems associated with the testing of such components include maintaining a complete, firm and reproducible electrical contact between the tab lead of the component and the testing unit. Results obtained during one testing must be reproducible with further testing, and this depends, to a great degree, on consistent, nonvarying electrical contact between tab lead and testing unit. Further, test data obtained by performing the test must be nonvarying while the test is being conducted over a time interval. Further, the test data must be consistent with test data obtained from repeated tests performed to assure that the ferrite component will retain its ability to operate according to desired standards. Reproducibility over periods of time again is affected by the reliability of the particular electrical precision test connector that connects the ferrite component to the testing unit.

Known test connectors include Vlijimen, et al., U.S. Pat. No. 3,627,929 relating to the distribution frame of a telephone exchange having a break jack assembly for disconnect cross connection and for connection to a test plug unit. The assembly has contact springs with rectilinear portions to provide flat contact surfaces. The flat contact surfaces are urged into contact with a plug member of a test plug unit. Keller, et al., U.S. Pat. No. 4,734,651, describes a device for testing for electrical continuity and short circuits between terminals of a multicontact electrical connector and conductive cores of electrical leads.

The device of the present invention is an electrical precision test connector assembly for interconnecting a testing unit with a subject component which is to be tested for electrical continuity, reflection coefficient or the like.

Forney, Jr. et al., U.S. Pat. No. 4,441,781 relates to a method for terminating coaxial cable and discloses a connector having a front shell, a rear shell, a dielectric insert, a center contact, a coupling and a locking ring. Johnson, U.S. Pat. No. 4,580,862, and Fisher, U.S. Pat. No. 4,697,859, disclose spring biased, float mounted connectors for coaxial cables.

The test connector of the present invention is characterized by an electrical conductor with a flexible, slotted end portion for slideable, clamping engagement with a tab lead of a ferrite component such as a circulator. Further, the shell of the test connector is spring biased so that its circular end is urged into complete annular, electrical contact with the body of the component to be tested.

SUMMARY OF THE INVENTION

One object of this invention is to provide a connector which may be interconnected so as to provide consistent, nonvarying contact to assure accurate and reproducible results. Another object of the invention is to provide such a connector that will assure accurate and reproducible results over an extended period of time and after repeated usage. Another object is to provide a device that quickly and easily may be connected and without the need for soldering. Since oftentimes the leads of the components to be tested are fragile and subject to damage, the connector must establish a reliable and complete connection without damaging the leads. Circulators are examples of test units with fragile gold-plated tab leads.

The test connector assembly of the present invention accomplishes these objectives and comprises an electrical conductor with conductive end portions and a hollow shell encircling the center electrical conductor. The electrical conductor comprises a flexible, slotted contact end portion with flat, opposing, electrical contact surfaces. The end portion is closed at one end for slideable, clamping engagement with an inserted tab connector to thereby maintain flat, biased, electrical contact, above and below, with a portion of a tab lead. The electrical conductor further is recessed at the opposite end portion for connection with a corresponding electrical conducting unit.

The hollow shell has a rear contact surface encircling the slotted contact end portion of the conductor and an outer body with a partial overlap portion and flange portion to define a groove between the bodies. The test connector assembly further comprises spring means positioned against the shell and biasing the shell into complete annular electrical contact of the circular contact surface with the complementary body of the component which is to be tested.

In a preferred embodiment, the hollow shell comprises a hollow jack body having end contact surface and an outer body with partial overlap portion with outward flange, circumferential to the outer body. The assembly includes a cup-shaped mounting member that has an inward lip encompassing the outer body of the shell to thereby define an annular groove between the body and the mounting member. A spring means is positioned within the groove. The spring means may be a coil spring with one end biased against the outward flange portion of the outer body and one end biased against the inward lip of the mounting member to urge the end contact surface of the jack body into complete, electrical contact with a complementary body of a test unit during connection.

One feature of the present invention is that the electrical center conductor is characterized by a precisely machined slot in a solid end section of the conductor which forms a continuous mating surface for the flat tab of the device being measured. The correct spring forces on the mating tab are obtained by drilling out the conductor from the opposite end to form two semicircular beam members. When in connection with a tab lead, the slotted contact end portion of the electrical conductor of the present invention forms a biasing, flat clamping engagement above and below the inserted tab lead so as to firmly hold the lead in electrically conductive relationship, without causing damage. It is a particular advantage of the present invention that this type of connection may be reproduced with reliable results for repeated testing over extended periods of time.

These and other advantages, features and objectives of the invention are disclosed by way of example from the following detailed description and accompanying drawings.

DESCRIPTION OF THE DRAWINGS

FIG. 1 is a side section view of an electrical precision test connector assembly which is a preferred embodiment of the present invention.

FIG. 1A is a view of a portion of the device of FIG. 1 and a tab lead taken along the lines 1A—1A of FIG. 1, and FIG. 1B is a perspective view of the same portion. Both figures illustrate the tab lead and the slotted contact end part of the connector.

FIG. 2 is an end view of the electrical precision test connector assembly of FIG. 1.

FIG. 3 is a fragmented perspective view, with parts exploded, of the electrical connector assembly shown in FIG. 1.

With reference to FIGS. 1, 2 and 3, each electrical precision test connector assembly 1 includes an electrical conductor 2, a hollow, bipartite, conductive shell 3, annular dielectric insert 4, retaining ring 5 and spring 6. Also shown is mounting member 7, which has a cup-shaped portion 10 encompassing, substantially, front outer body 8 and rear hollow jack body 9 of the bipartite shell 3 and a flange portion 11 with holes 12 and 13 to accommodate fasteners 48 such as bolts for mounting the test connector assembly 1. The hollow bipartite shell comprises threaded front outer body 8 and rear hollow jack body 9. Front body 8 has stepped bore 14 extending therethrough including recess 15, inwardly flanged 16, to accept a corresponding connection of a conventional coaxial cable connector (not shown), center barrel section and rear section 18 having bore of greater diameter than that of the barrel section 17. Front outer body 8 has three cylindrical portions 49, 50 and 51 of different outer and inner circumference, and outward threaded portion 52 for threadable connection with a testing unit such as an automatic network analyzer. Cylindrical portions 49 and 50 form outer flange 45, and portions 50 and 51 form inner flange 53. Front body 8 has inward thread 20 on its inside rear wall and terminates in annular wall 21.

Figure 4A:
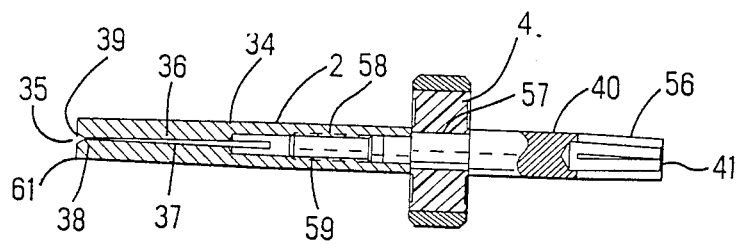
FIGS. 4A to 4D are a series of section views of various embodiments of the electrical conductor of the precision test connector assembly of the present invention.

Hollow bipartite body 3 further includes rear hollow body 9 with uniform core 22 with threading 23 for insertion into front body 8 and connection with corresponding threading 20 of front body 8, end contact surface 24 and forward annular end 25.

Annular dielectric insert 4 includes outer ring 26 and dielectric 27 which define bore 28 for securing electrical conductor 2 into fixed position. Dielectric 27 is characterized by outer bead 29 and inner bead 30. Outer bead 29 provides a lip for the securing of insert 4 within recess 33 formed between forward end 25 of rear body 9 and inner flange 53 of front body 8. Inner bead 30 provides a lip for the securing of the electrical conductor 2.

FIGS. 4A through 4D show various embodiments of the electrical conductor 2 of the present invention. With reference to FIG. 4A, shown is a preferred embodiment which is a substantially barrel-shaped bipartite body of parts 34 and 40. Part 34 is a solid end section characterized by a precisely machined slot 35 for slideable engagement with the inserted input/output tab lead 55 of a ferrite component 54, such as a circulator, which is to be evaluated to determine return loss, insertion loss for reflection coefficient, and the like. As shown in FIG. 4A, the electrical conductor 2 comprises a resilient spring, slotted contact end part 34 with flat, opposing contact surfaces 36 and 37. End part 34 is biased into a closed position 38 when not engaged with the tab lead of a ferrite component. The nose 61 of slotted part 34 may be beveled 39 to provide a flared entry for the tab lead 55 of the circulator 54. The adapter part 40 of electrical conductor 2 has a clamping ring portion 56 with recess 41 for connection with a plug-type connector. Adapter part 40 has waist section 57 for fitting within the bore 28 of annular dielectric insert 4 and outward threads 58 for interconnection with the inner threads 59 of part 34.

Figure 4B:
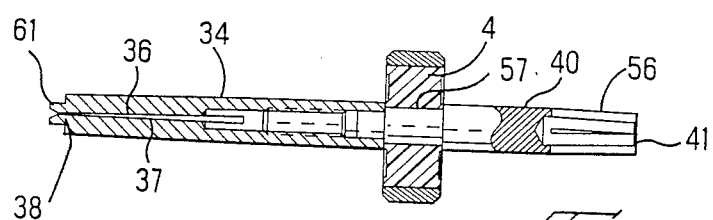
Figure 4C:
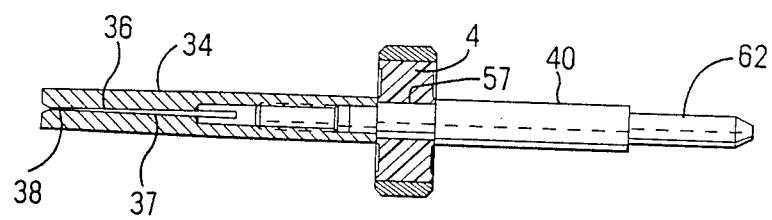
Figure 4D:
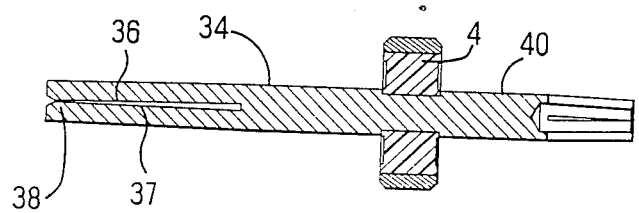

Shown in FIGS. 4B through 4D are further embodiments of electrical conductor 2. Where elements are the same, numbering follows the convention of FIGS. 1, 1A, 1B and 4A. Each embodiment is characterized by a solid end section 34 having a precisely machined slot 35 for slideable engagement with the inserted input/output tab lead 55 of a ferrite component 54. In FIG. 4B, the nose 61 is both beveled and extended to an engagement with the tab lead 55 (shown in FIGS. 1, 1A and 1B). The nose 61 is extended to provide a surface to oppose a portion of a center conductor within the body of a particular type of circulator, and the tab lead 55 extends through a recess on the circulator body. In FIG. 4C, adapter portion 40 includes a male contact 62 to convert the jack connector 41 of FIGS. 4A and 4B to a plug-type connector. The electrical conductor 2 comprises the resilient spring, slotted contact end part 34 and the described interconnected adapter part 40 having a male contact end portion 62. In FIG. 4D, slotted part 34 and adapter portion 40 are of a single piece with dielectric insert 4 as an additional one-piece part. Single piece connector 40 may be produced in a single manufacturing step.

With reference again to FIGS. 1, 2 and 3, cup-shaped portion 10 of mounting member 7 is inward-lipped to form annular flange 44. Correspondingly, front outer body of the hollow bipartite shell 3 has an outer flange 45 formed by cylindrical portions 49 and 50 which, in conjunction with flange 44 of the mounting member 7, define an annular recess 46 circumferential to the barrel of part 50 of shell 3. Spring means 6 shown as a coil spring is positioned within the annular recess 46 with one end biased against the outward flange 45 of front outer body 8 and one end biased against the inward flange 44 of the mounting member 7 to urge the contact surface 24 of part 9 into complete electrical contact with complementary surface 60 of a testing unit or ferrite component 54.

In operation, the electrical precision test connector 1 is attached to a testing unit, such as an automatic vector network analyzer, usually by mating with a plug of the analyzer into the recess 41 of the clamping ring portion 56 of the connector 1. Thereafter, and one-by-one, the ferrite components, such as circulators, having tab leads 55, are connected to connector 1 by inserting a lead 55 within resilient spring, slotted contact end part 34 to form a slideable, clamping engagement both above and below the lead. Spring means 6 urges end contact surface 24 forward and against the body of the circulator so that forward annular end 24 abuts the body of the circulator to provide a conductive electrical contact between the body of the circulator and the hollow shell 9 of the test connector 1. The circulator is tested while contact surfaces 36 and 37 maintain flat, biased electrical contact above and below a portion of the tab lead 55. Upon completion of testing, the lead 55 is withdrawn and the tab lead 55 of another circulator is connected for testing.

Although described with particular reference to the testing of ferrite components, the electrical precision test connector of the present invention may be used with any component of the "drop in" type having tab leads for soldering to a circuit board. Suitable devices include switches, amplifiers, attenuators, mixers, filters, terminations, transformers, frequency multipliers, limiters, directional couplers, power splitters and combiners, phase shifters, duplexers, discriminators, modulators and oscillators. The present electrical precision test connector permits reliable and accurate testing of such devices without damaging tab leads.

We claim:

1. An electrical precision test connector assembly comprising an electrical conductor with conductive end portions and a hollow shell encircling the electrical conductor;

wherein the electrical conductor comprises a resilient spring, slotted contact end part with flat, opposing electrical contact surfaces and said portion being pinched for a slideable, clamping engagement, above and below, with an inserted tab lead to thereby maintain flat, biased electrical contact above and below a portion of the lead; the hollow shell comprises rear contact surface encircling the slotted contact end portion of the conductor; and the test connector assembly further comprises a spring means positioned against the shell and biasing the shell into complete electrical contact of the rear contact surface with a corresponding body of a component which is to be tested.

2. The electrical precision test connector assembly of claim 1 wherein the electrical conductor is recessed at the end portion opposite the slotted end portion, for connection with a corresponding plug-type connector.

3. The electrical precision test connector of claim 1 wherein the electrical conductor comprises a resilient spring, slotted contact end part and an interconnected adapter part having a male end portion at the end opposite from the end of interconnection.

4. The electrical precision test connector of claim 1 further comprising an annular dielectric insert positioned within the shell and encircling the electrical conductor.

5. The electrical precision test connector of claim 4 wherein the annular dielectric insert includes an outer ring and an inner ring, the inner ring having outer bead for securing of the ring within the shell and inner bead for securing of the electrical conductor to the insert.

6. The electrical precision test connector assembly of claim 1 wherein the hollow shell comprises a hollow jack body with said rear contact surface and an outer body with partial overlap portion with outward flange circumferential to the outer body and further comprising cup-shaped mounting member with inward lip encompassing the outer body to define an annular groove between outer body and mounting member.

7. The electrical precision test connector of claim 6 further comprising the spring means positioned within the annular groove with one end biased against the outward flange of the outer body and one end biased against the inward lip of the mounting member to urge the contact surface of the jack body into complete electrical contact with a corresponding body of a component which is to be tested.

8. The electrical precision test connector assembly of claim 7 wherein the electrical conductor is recessed at the end portion opposite the slotted end portion, for connection with a corresponding electrical conductor.

9. The electrical precision test connector of claim 7 wherein the electrical conductor comprises a resilient spring, slotted contact end part and an interconnected adapter part having a male end portion at the end opposite from the end of interconnection to convert the electrical conductor to a male connector.

10. The electrical precision test connector of claim 7 further comprising an annular dielectric insert positioned within the bipartite shell and encircling the electrical conductor.

11. The electrical precision test connector of claim 10 wherein the annular dielectric insert includes an outer ring and an inner ring, the inner ring having outer bead for securing of the ring within the shell and inner bead for securing of the electrical conductor to the insert.

* * * * *